United States Patent [19]

Oudar

[11] Patent Number: 4,468,772
[45] Date of Patent: Aug. 28, 1984

[54] BISTABLE OPTICAL DEVICE

[76] Inventor: Jean-Louis Oudar, 27, Avenue du Plessis, 92290 Chatenay-Malabry, France

[21] Appl. No.: 368,528

[22] Filed: Apr. 15, 1982

[51] Int. Cl.$^3$ ............................................. H01E 3/19
[52] U.S. Cl. .......................................... 372/8; 372/50
[58] Field of Search .................... 372/8, 50, 68, 96; 357/17

[56] References Cited

U.S. PATENT DOCUMENTS 3,303,431  2/1967  Fowler ................................. 372/8
3,610,731  10/1971  Seidel ................................. 372/8
3,760,201  9/1973  Nisizawa et al. .................. 372/8

Primary Examiner—James W. Davie
Attorney, Agent, or Firm—Handal & Morofsky

[57] ABSTRACT

Bistable optical device comprising two lasers. The light beam which can be emitted by one of the lasers passes through the amplifying medium of the other and vice versa. According to the invention the lasers are of the semiconductor type and the resonators of the two lasers are tuned to two different wavelengths, the directions of these two beams coinciding.

5 Claims, 7 Drawing Figures

BISTABLE OPTICAL DEVICE

BACKGROUND OF THE INVENTION

The present invention relates to a bistable optical device using two coupled lasers operating at different wavelengths. It is used in optics, more particularly in integrated optics.

A bistable system is a system having two stable states, the transfer from one state to the other taking place by the temporary modification of certain conditions applied to the system. When these conditions remain unchanged, the system remains indefinitely in one or other of these two states.

Bistable systems are widely used in electronics in the storage of binary signals, the formation of pulses with a steep front or the switching of signals.

Recent developments in optics and particularly integrated optics has led to a need for devices of this type, but which are optical and not electronic.

Hybrid optoelectronic systems are already known and use an intermediate process of an electronic nature between two optical processes. For example optoelectronic transfer is brought about by means of a photodetector and the electronooptical return by means of a light modulation system. The bistability function is devolved to the intermediate electronic process. Naturally such systems are complex, as well as being slow.

In addition, purely optical devices are known, which have the property of bistability. These are systems constituted by a Fabry-Perot resonator in which is inserted a material, whereof one of the optical properties (absorption, refractive index, etc.) can be modified by auxiliary light radiation. The materials frequently used for this purpose have a saturable absorption, i.e. an absorption which decreases in the case of an increase of the light intensity of the radiation passing through them. Such a bistable device is described, for example, in U.S. Pat. No. 3,610,731 of H. Seidel, entitled "Bistable optical circuits using saturable absorber within a resonant cavity".

Such systems have a transmission by stability in that it is the transmitted light intensity which has two different values, one being high when the absorbent is not saturated and the other high when the absorbent is saturated by the auxiliary beam.

However, a device of this type has two major disadvantages:

the light intensity of the output beam is, for these two states, below the intensity of the input beam, whilst the intensities of the available beams are not the same for both states, which is an obstacle to the series-arrangement of several bistable devices;

for at least one of the two stable states (that which in the circumstances corresponds to a high transmitted intensity) it is necessary for the device to be permanently supplied by an auxiliary light beam, which requires an external auxiliary source, e.g. a laser.

Other bistable optical devices are known, which have been designed to obviate these disadvantages. These devices use two identical lasers, one emitting through the amplifying medium of the other and vice versa. Thus, the two lasers are in competition and only one of them can oscillate to the detriment of the other. The following mechanism leads to bistability.

Each appropriately excited amplifying medium is the seat of a population inversion, which gives the said medium the capacity to amplify radiation. For a laser to oscillate, it is necessary that the gain of its amplifying medium preponderates over the losses of the resonator. When one of the lasers is in this situation, it emits a light beam, which passes through the amplifying medium of the other laser. This beam is amplified by the second laser, which has the effect of reducing the population inversion inherent in the second laser. Thus, the gain of the amplifying medium of the second laser is reduced. This gain can drop to a value inadequate for compensating the losses of the resonator, so that the second laser is inhibited by the first. Thus, the system is in a first state in which only the first laser oscillates.

If the first laser stops emitting for a short time, either because its gain is artificially lowered to a value below the losses, or because the losses are increased, the gain saturation phenomenon of the second laser is ended and this laser is under favourable conditions to oscillate. It is then the second laser which emits a light beam. This beam traverses the amplifying medium of the first laser, whose gain drops below the threshold, which prevents it from oscillating. The system is then in a second state corresponding to the oscillation of the second laser.

Thus, such a device can be in one or the other of two states, depending on whether one of the lasers is emitting or not. Thus, such a device has an emission bistability and not an absorption bistability. Moreover, it has a perfect symmetry, because the two light beams corresponding to the two states of the device have the same intensity, which obviates the first disadvantage referred to hereinbefore. Moreover, the switching between states is obtained by a very brief action on one of the lasers and does not require a permanent auxiliary source. Therefore it also obviates the second disadvantage referred to hereinbefore.

A bistable device of this type is described in U.S. Pat. No. 3,760,201, granted on Sept. 18, 1973 and entitled "Optical flip-flop element", as well as in the article entitled "Mutually quenched injection lasers as bistable devices" published by G. J. Lasher and A. B. Fowler in IBM Journal of Research and Development, vol. 8. no. 9, September 1964, New York.

However, despite the interest of such devices a serious disadvantage remains. Thus, with such devices the two light beams emitted by the device differ from one another by their direction, which are generally orthogonal. Thus, the beam emitted by one of the lasers passes through the amplifying medium of the other in a transverse manner. This clearly presupposes that the width of the light beam emitted by one of the lasers is of the same order of magnitude as the length of the amplifying medium to ensure that the passage through said medium by the beam leads to significant effects. However, as the device is symmetrical, this implies that the width of the amplifying medium must be roughly equal to its length. In other words, such a device must use amplifying mediums with a substantially square cross-section. This is described in the two documents referred to hereinbefore.

However, such a structure is totally unsuitable for semiconductor lasers in which the amplifying medium is in the form of a strip, whose width is much smaller than its length. The width-length ratio can even drop to values of about 1:100 in the case of lasers used in integrated devices for optical telecommunications. Consequently there is no question of transmitting light beams transversely into the amplifying media, because only minimal effects would result.

BRIEF SUMMARY OF THE INVENTION

The object of the present invention is to obviate this disadvantage. To this end it proposes a bistable optical device of the type described hereinbefore, but which has the special feature that the two competing lasers function on different wavelengths. In this way it is no longer necessary to distinguish the two beams emitted by the device on the basis of their directions, because these two beams have different wavelengths. Therefore the beam emitted by one of the lasers can be introduced in accordance with the longitudinal axis of the amplifying medium of the other laser and not transversely. As a result the device according to the invention can be formed by two lasers positioned end to end, one emitting into the other and vice versa. This arrangement opens the way to very simple integrated bistable devices. Naturally the difference between the two wavelengths must not exceed the width of the amplification line of the active medium in order to ensure the development of the gain saturation phenomena.

More specifically the present invention relates to a bistable optical device comprising two lasers, formed in each case by an amplifying medium located in a resonator tuned to a wavelength, each laser being able to emit a light beam at the said wavelength in accordance with a particular direction, the device also comprising means permitting the mutual coupling of the two lasers by directing the light beam liable to be emitted by one of the lasers through the amplifying medium of the other laser and vice versa, wherein the lasers are semiconductor lasers and wherein the resonators of two lasers are tuned to two different wavelengths, the directions of the two beams which can be emitted coinciding.

According to a first variant, each resonator comprises a diffraction grating having a certain spacing, the spacings of two gratings of two resonators differing.

According to a second variant, each resonator comprises a distributed diffraction grating in the amplifying medium, each grating having a particular spacing, the spacings of the two gratings differing.

According to yet another variant, each laser is in the form of rings having a particular length, the lengths of two rings differing.

In order to bring about the switching of the device from one state to the other, it is possible to act:
either on the resonators of the lasers to modify their losses (reduction of the losses of the laser which does not emit or increase of the losses of the emitting laser), for which purpose electrooptical or acoustooptical modulators can be used, like those used in triggered lasers;
or on the amplifying media to modify their gain (reduction of the gain of the emitting laser or increase of the gain of the laser which does not emit), which can easily be obtained by modifying the injection current intensity, it also being possible to reduce the gain of one of the amplifying media by means of an auxiliary light beam passed through it in accordance with the very principle of the device, whereby this auxiliary beam can come from another bistable optical device of the same type, so that the bistable devices can be connected in cascade leading to an "all-optical" chain of bistable devices.

BRIEF DESCRIPTION OF THE DRAWINGS

The invention is described in greater detail hereinafter relative to non-limitative embodiments and with reference to the attached drawings, wherein show.

DETAILED DESCRIPTION OF THE PREFERRED EMBODIMENTS

Figure 1:
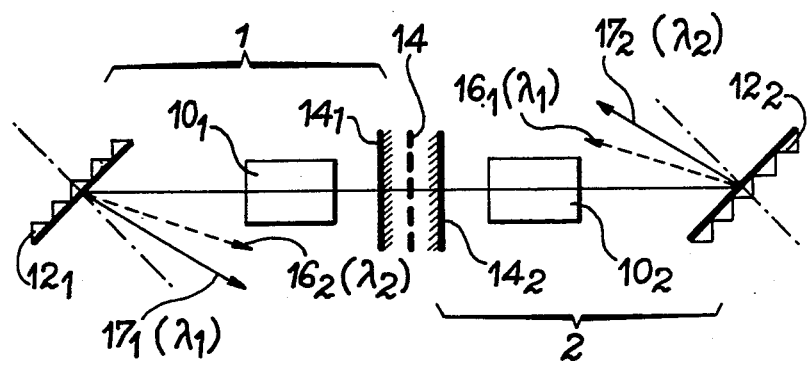
FIG. 1 the circuit diagram of a device according to the invention.

The device according to FIG. 1 essentially comprises two lasers 1 and 2, the elements constituting the two lasers being designated by references followed by a subscripted 1 or 2 depending on whether they belong to laser 1 or laser 2, this convention also applying to the following drawings. Each laser comprises an amplifying medium $10_1$, $10_2$ placed in a resonator formed by a diffraction grating $12_1$, $12_2$ and by a mirror $14_1$, $14_2$. These mirrors are semitransparent. The light beam $16_1$ or $16_2$ emitted by one of the lasers through the semitransparent mirror $14_1$ or $14_2$ traverses the amplifying medium of the other associated laser $10_2$, $10_1$ respectively. These beams are diagrammatically indicated by broken lines. Moreover, gratings $12_1$, $12_2$ can diffract beams $17_1$, $17_2$.

It can be seen that the mirrors $14_1$ and $14_2$ can be combined into a single mirror 14, common to the two lasers.

Figure 2:
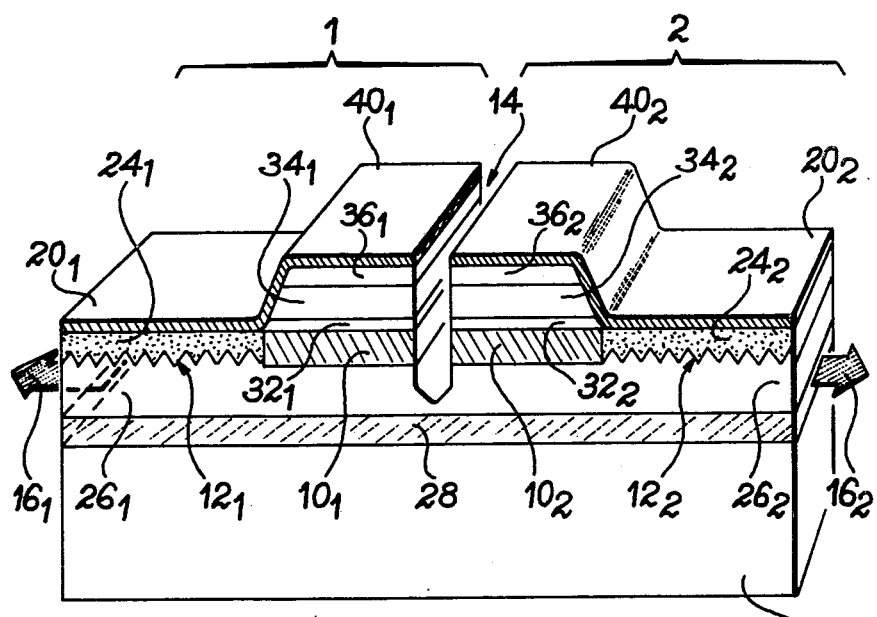
FIG. 2 a first variant of the construction of such a device.

In practice, the diffraction gratings need not be located outside the laser and are generally incorporated into the latter in the manner shown in FIG. 2 in an embodiment relating to lasers called "integrated twin-guide lasers with distributed Bragg reflector" or abbreviated to "d.b.r.i.t.g. lasers". Such a technology is more particularly described in the article by K. UTAKA et al. entitled "1.5–1.6 $\mu$m Ga In As P/In P integrated Twin-Guide lasers with first order distributed Bragg reflectors", published in "Electronics Letters", June 5, 1980, vol. 16, no. 12. Each laser comprises a gold layer $20_1$, $20_2$, an $SiO_2$ layer $24_1$, $24_2$ deforming a diffraction grating, an e.g. n-type InP separating layer $26_1$, $26_2$, an output guide 28 made from $Ga_uIn_{1-u}As_vP_{1-v}$ (u and $<$1), and a type-n InP substrate 30. Each amplifying medium comprises an active zone $10_1$, $10_2$ of $Ga_xIn_{1-x}As_yP_{1-y}$ ($x$ and $y<1$), a type-p Ga In As P layer $32_1$ $32_2$, a type-p InP layer $34_1$, $34_2$ and finally a Ga In As P contact layer $36_1$, $36_2$, all of this being surmounted by a gold layer $40_1$, $40_2$.

The two lasers 1 and 2 are separated by a groove 14 obtained by chemical etching (e.g. by means of an acid solution). The edges of the groove form partly reflecting faces, permitting the optical coupling of the two lasers.

According to the invention, in such a structure, the spacings of the two gratings $12_1$ and $12_2$ obtained by the oxide layer $24_1$, $24_2$ differ, so that the two lasers oscillate at different wavelengths. According to the special feature of coupling guide lasers, the two radiations $16_1$, $16_2$ are extracted by guide 28.

As is also known in connection with semiconductor lasers, the diffraction grating can be distributed along the amplifying medium instead of being placed at one end, giving a so-called DFB laser, as an abbreviation of "Distributed Feedback". Such a method can also be used in the present invention and as illustrated in FIG. 3.

Figure 3:
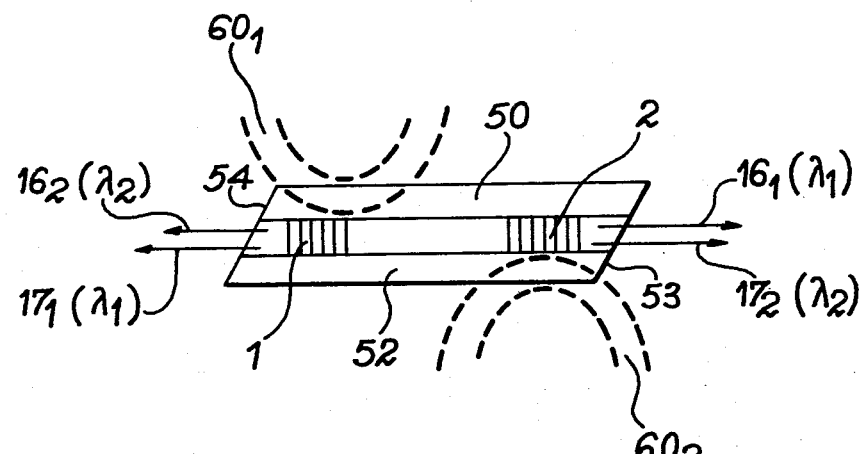
FIG. 3 a second variant with a distributed grating.

In FIG. 3, the two lasers are coupled by a waveguide 50, the assembly being deposited on a substrate 52, whose split faces 53, 54 can be inclined to prevent parasitic reflections. The complementary outputs $16_1$, $17_2$ or $16_2$, $17_1$ also differ on the basis of their wavelengths $\lambda_1$, $\lambda_2$.

In such an embodiment it is possible to switch the system from one state to another by introducing radiation with the appropriate wavelength into one of the lasers. This introduction can be carried out by the bias of an optical coupler indicated by the dashes ($60_1$, $60_2$). This coupler can be positioned laterally in the vicinity of the distributed grating or more advantageously beneath the active layer, as in the case of guide 28 of FIG. 2.

Figure 4:
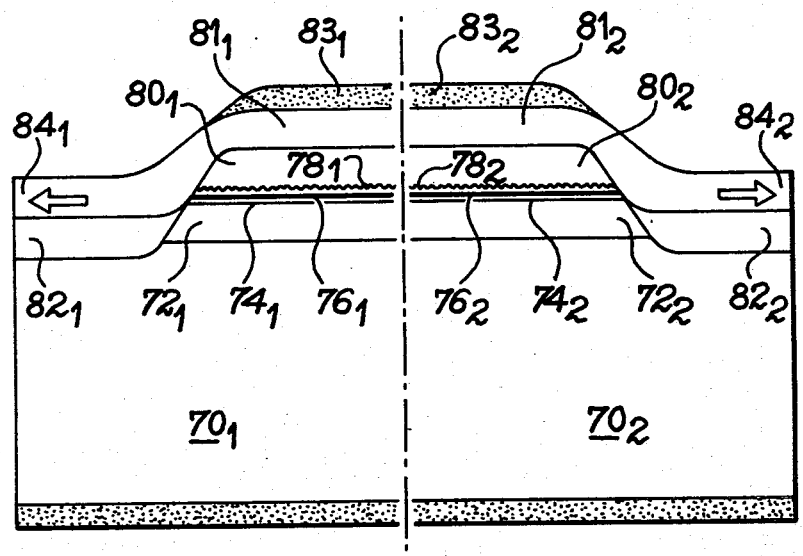
FIG. 4 another embodiment with a distributed grating.
Figure 5:
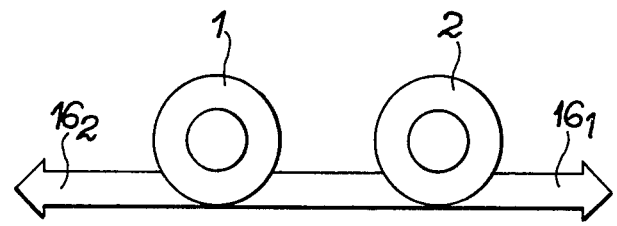
FIG. 5 a variant of the device using two ring lasers.

In practice a distributed grating bistable device can be in the form illustrated in FIG. 4, which uses two DFB lasers in accordance with a method described by K. AIKI et al in an article entitled "Frequency Multiplexing light source with monolithically Integrated Distributed-feedback diode lasers", published in Applied Physics Letters, vol. 29, no. 8, Oct. 15, 1976, p. 507. As represented, the device comprises an n-Ga As substrate $70_1$, $70_2$, an n-$Ga_{0.7}Al_{0.3}As$ layer $72_1$, $72_2$, a p-Ga As active layer $74_1$, $74_2$, a p-$Ga_{0.8}Al_{0.8}Al_{0.2}As$ layer $76_1$, $76_2$ surmounted by a p-$Ga_{0.93}Al_{0.7}As$ layer $78_1$, $78_2$ forming the distributed grating, a p-$Ga_{0.7}Al_{0.3}As$ layer $80_1$, $80_2$, a diffused Zn layer 81 and a conducting layer 83. Radiation output takes place by means of a waveguide comprising a p-$Ga_{0.7}Al_{0.3}Al$ layer $82_1$, $82_2$ surmounted by an undoped $Ga_{0.9}Al_{0.1}As$ layer $84_1$, $84_2$.

According to the invention such a device comprises two distributed gratings with different spacings.

In the preceding embodiments, the oscillating frequency difference of the resonators is obtained by giving the gratings unequal spacings. However, the invention can be differently applied by using resonators having different lengths. It is known that the oscillating frequency or frequencies of a resonator is a function of its length. Therefore two resonators of different lengths will oscillate at two different wavelengths. This variant is particularly advantageous in the case of ring lasers (circular or semicircular), whose circumferences or semi-circumferences are unequal. Such lasers are described in Applied Physics Letters, May 15, 1980, vol. 36, p. 801.

Figure 6:
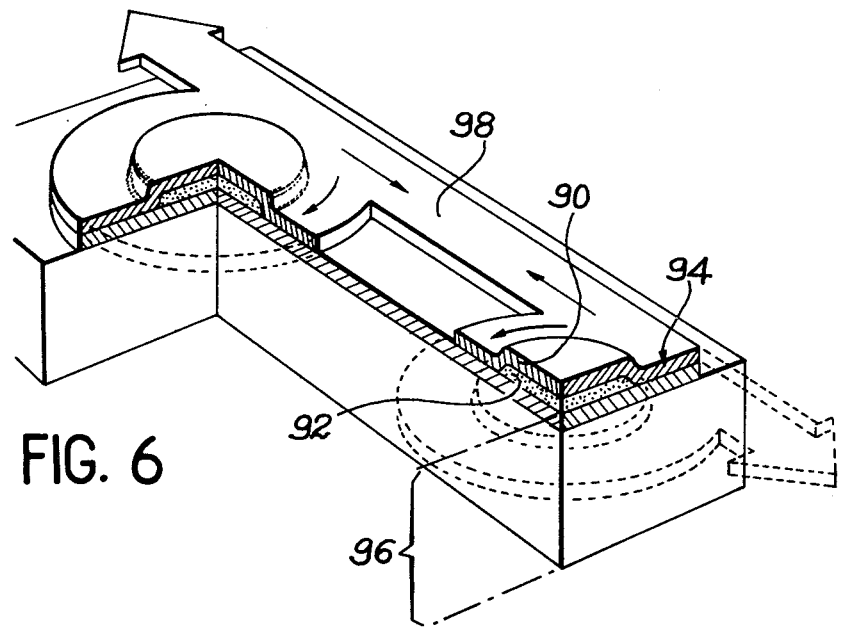
FIG. 6 a special embodiment of the ring laser device.

In practice, the device using two ring lasers can be constructed in accordance with FIG. 6 using a technology described by A. S. H. Liao and S. Wang in an article entitled "Semiconductor injection lasers with a circular resonator", published in Applied Physics Letters, 36, 10, May 15, 1980, p. 801. Each laser comprises an NiCr-Au metallic layer 92, a $SiO_2$ layer 92 limiting the current injection to a cylindrical ring 94 and a GaAs/GaAlAs heterostructure 96. The radiation is coupled outside the ring by a waveguide 98. Thus, the two lasers are mutually coupled by this guide.

Figure 7:
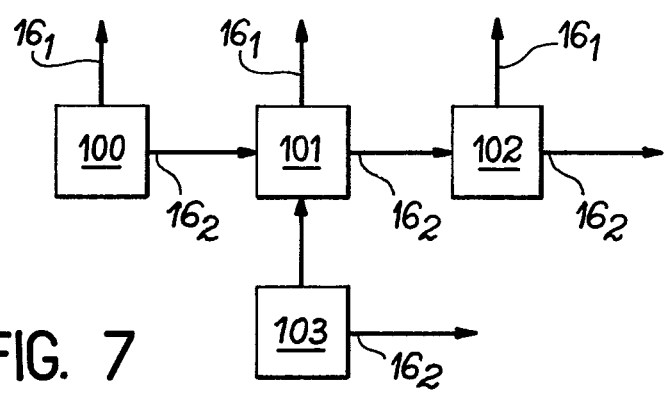
FIG. 7 a chain of bistable devices according to the invention.

Finally, FIG. 7 illustrates a chain of bistable optical devices 100, 101, 102, etc. according to the invention, each device emitting one or other of the two beams $16_1$, $16_2$, the second being used for controlling the following device, i.e. directed through the amplifying medium of one of the lasers to bring about the switching of the device.

What is claimed is:

1. A bistable optical device having two active states comprising:
    (a) a first semiconductor laser heterostructure comprising first resonating means and a first amplifying medium, said resonating means being tuned to oscillate and emit light of a first predetermined and characteristic frequency and being disposed adjacent said first amplifying medium;
    (b) a second semiconductor laser heterostructure comprising second resonating means and a second amplifying medium, said resonating means being tuned to oscillate and emit light of a second predetermined and characteristic frequency and being disposed adjacent said second amplifying medium, said second predetermined frequency being different and logically distinguishable from said first predetermined frequency;
    (c) electrode means for introducing power to said amplifying media;
    (d) means for supporting said first and second laser heterostructures; and
    (e) means for optically coupling said laser heterostructures so that light of said first characteristic frequency from said first laser heterostructure communicates with said second amplifying medium of said second laser heterostructure and light of said second characteristic frequency from said second laser heterostructure communicates with said first amplifying medium, said first characteristic frequency being within the amplifying range of said first and said second amplifying medium and said second characteristic frequency being within the amplifying range of said first and said second amplifying media.

2. In a bistable optical device:
    (a) a first semi-conductor laser heterostructure comprising first resonating means, said first resonating means having first diffraction grating means with a first spacing for selecting light of a first predetermined wavelength, and a first amplifying medium, said first resonating means and said first amplifying medium forming means for emitting coherent light of said first wavelength along a first direction;
    (b) a second semiconductor laser heterostructure comprising second resonating means, said second resonating means having second diffraction grating means with a second spacing different from said first spacing for selecting light of a second predetermined wavelength different from said first wavelength, and a second amplifying medium, said second resonating means and said second amplifying medium forming means for emitting coherent light of said second wavelength along a second direction, said second laser heterostructure being positioned and configured so that second direction coincides with said first direction; and
    (c) means for optically coupling said first laser heterostructure so that coherent light of said first wavelength from said first laser heterostructure communicates with said second amplifying medium of said second wavelength from said second laser heterostructure communicates with said first amplifying medium of said first laser heterostructure.

3. A device according to claim 2 further comprising a substrate, an optical guide disposed upon said substrate, a transparent separating layer disposed upon said optical guide, and an oxide layer, wherein said first and said second laser heterostructure comprise an active layer and further comprise a confinement layer, a contact layer and a metallic layer acting as an electrode, said active confinement, contact and metallic layers defining a central portion, said oxide layer being deposited on said separating layer adjacent said active layer of said central portion, said oxide layer defining said first and said second diffraction grating means respectively, said central portion being etched in its middle so it defines a groove extending through said metallic, confinement and active layers and partly into said separating layer, said groove delimiting said first laser heterostructure on one side from said second laser heterostructure on another side of said groove.

4. The combination according to claim 2, wherein said diffraction grating means are diffraction gratings distributed in said amplifying media.

5. In a bistable opticle device, a semi-conductor laser structure comprising on a substrate:
 (a) a first heterostructure having a first active layer, a first circular isolating layer on said first heterostructure and a first circular metallic layer covering said first circular isolating layer and said first heterostructure and acting as a first ring electrode having a first length;
 (b) a second heterostructure having a second active layer, a second circular isolating layer on said second heterostructure and a second circular metallic layer covering said first circular isolating layer and second heterostructure and acting as a second ring electrode having a second length, said second length being different from said first length; and
 (c) a waveguide for optically coupling said first active layer and said second active layer.

* * * * *